US006570137B1

(12) United States Patent
Jennings

(10) Patent No.: US 6,570,137 B1
(45) Date of Patent: May 27, 2003

(54) SYSTEM AND METHOD FOR LAMP SPLIT ZONE CONTROL

(75) Inventor: Dean Jennings, San Ramon, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/092,275

(22) Filed: Mar. 4, 2002

(51) Int. Cl.$^7$ .................................................. F27B 5/14
(52) U.S. Cl. ........................ 219/411; 219/390; 219/497; 392/418
(58) Field of Search ................................ 219/390, 405, 219/411, 497; 392/416, 418; 118/724, 725, 50.1

(56) References Cited

U.S. PATENT DOCUMENTS

| | | | |
|---|---|---|---|
| 3,862,397 A | * | 1/1975 | Anderson et al. ........... 219/405 |
| 4,820,906 A | | 4/1989 | Stultz |
| 5,444,815 A | | 8/1995 | Lee et al. |
| 5,446,825 A | | 8/1995 | Moslehi et al. |
| 5,650,082 A | | 7/1997 | Anderson |
| 5,889,258 A | * | 3/1999 | Lubomirski et al. ........ 219/405 |
| 5,937,142 A | | 8/1999 | Moslehi et al. |
| 6,016,383 A | | 1/2000 | Gronet et al. |
| 6,034,356 A | | 3/2000 | Paranjpe |
| 6,210,484 B1 | | 4/2001 | Hathaway |
| 6,331,697 B2 | | 12/2001 | Savas |
| 6,376,804 B1 | * | 4/2002 | Ranish et al. ............... 219/390 |
| 6,396,289 B1 | * | 5/2002 | Schmitt ....................... 324/713 |
| 6,414,279 B1 | * | 7/2002 | Suzuki et al. ............... 219/405 |

OTHER PUBLICATIONS

Cochran and Graves, "Rapid Thermal Annealing", *ENEE Group Activity #5* (Oct. 30, 2001).

* cited by examiner

*Primary Examiner*—Teresa Walberg
*Assistant Examiner*—Shawntina Fuqua
(74) *Attorney, Agent, or Firm*—Pennie & Edmonds, LLP

(57) ABSTRACT

An operating voltage is supplied to first and second groups in accordance with a recipe for thermally processing a semiconductor wafer. It is then determined that the operating voltage is an undesired voltage in a range of voltages between a predetermined lower voltage and a predetermined upper voltage. Subsequently, a first voltage is applied to the first group of heating lamps and a second voltage is delivered to the second group of heating lamps. The first voltage is above the predetermined upper voltage, while the second voltage is below the predetermined lower voltage. Also, a weighted average of the first and second voltages approximates the undesired voltage. In the meantime, the operational voltage is supplied to a remainder of the array of heating lamps in accordance with the recipe, where the operational voltage is below the predetermined upper voltage.

20 Claims, 10 Drawing Sheets

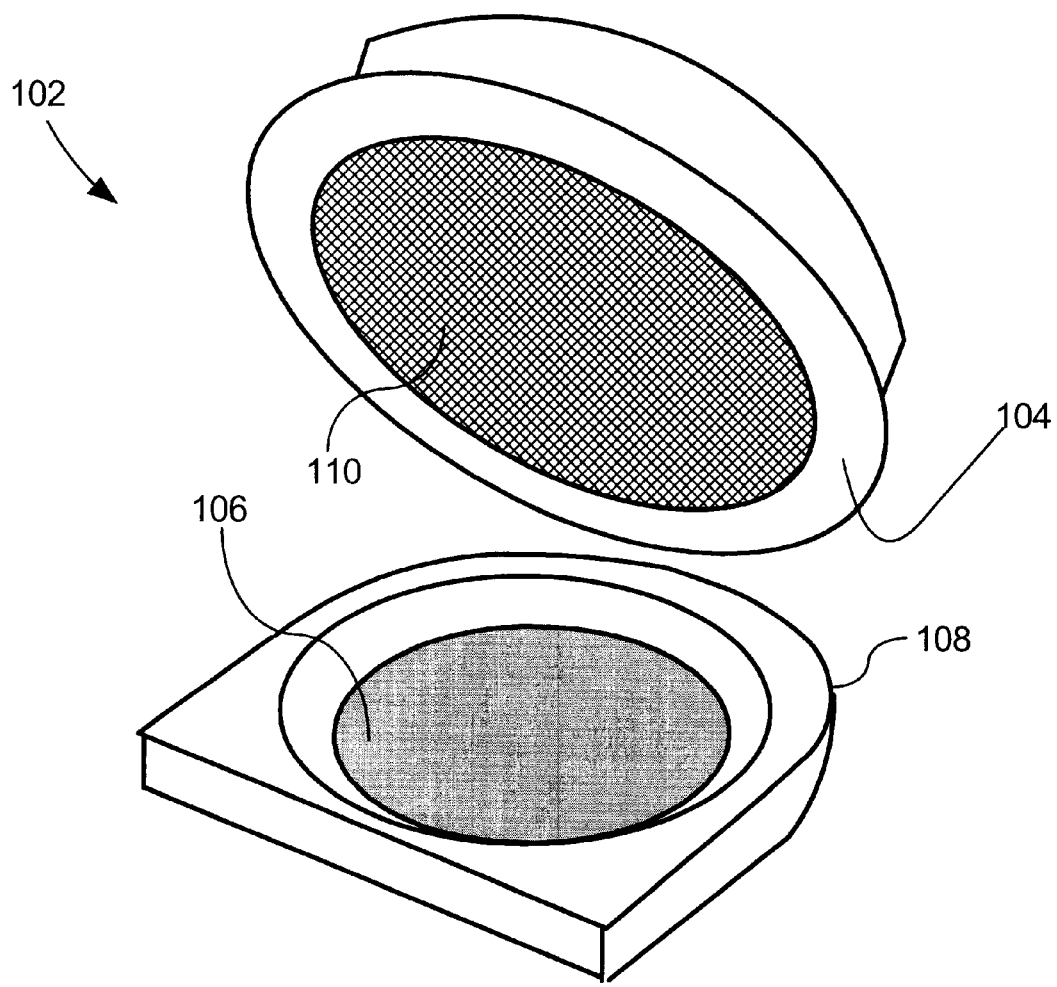
(PRIOR ART)
FIG. 1

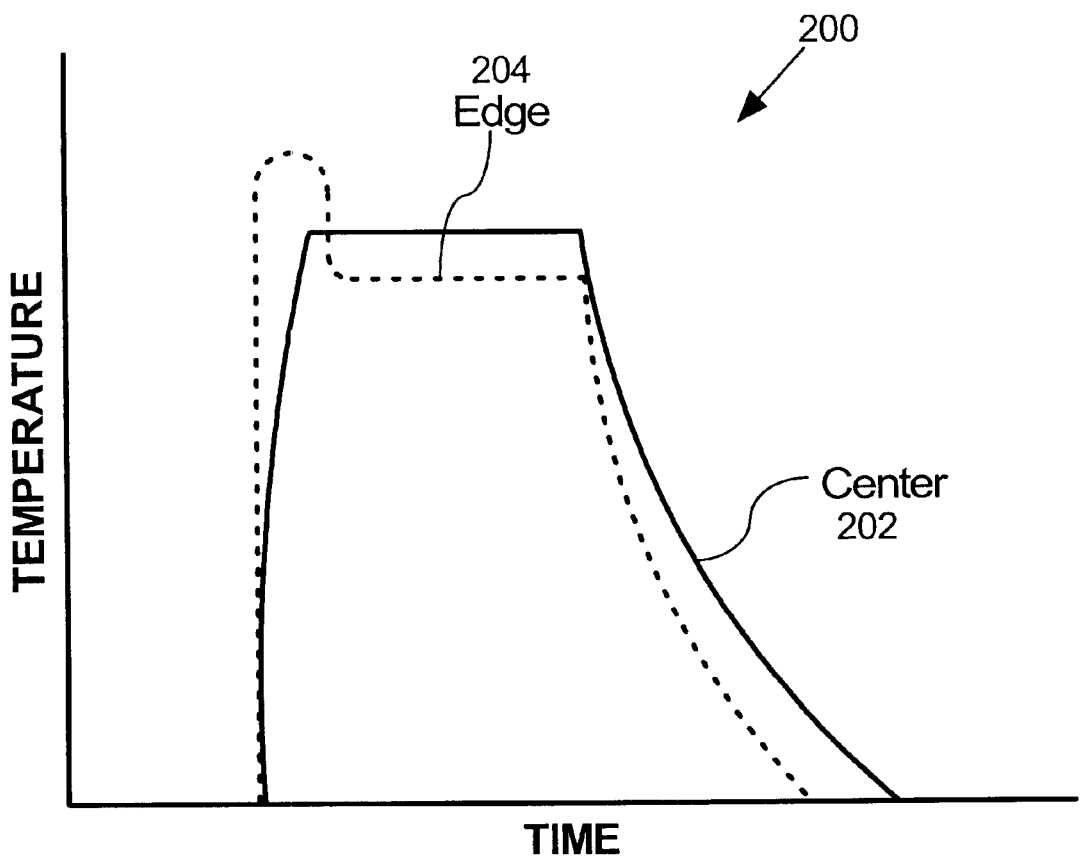
(PRIOR ART)
FIG. 2

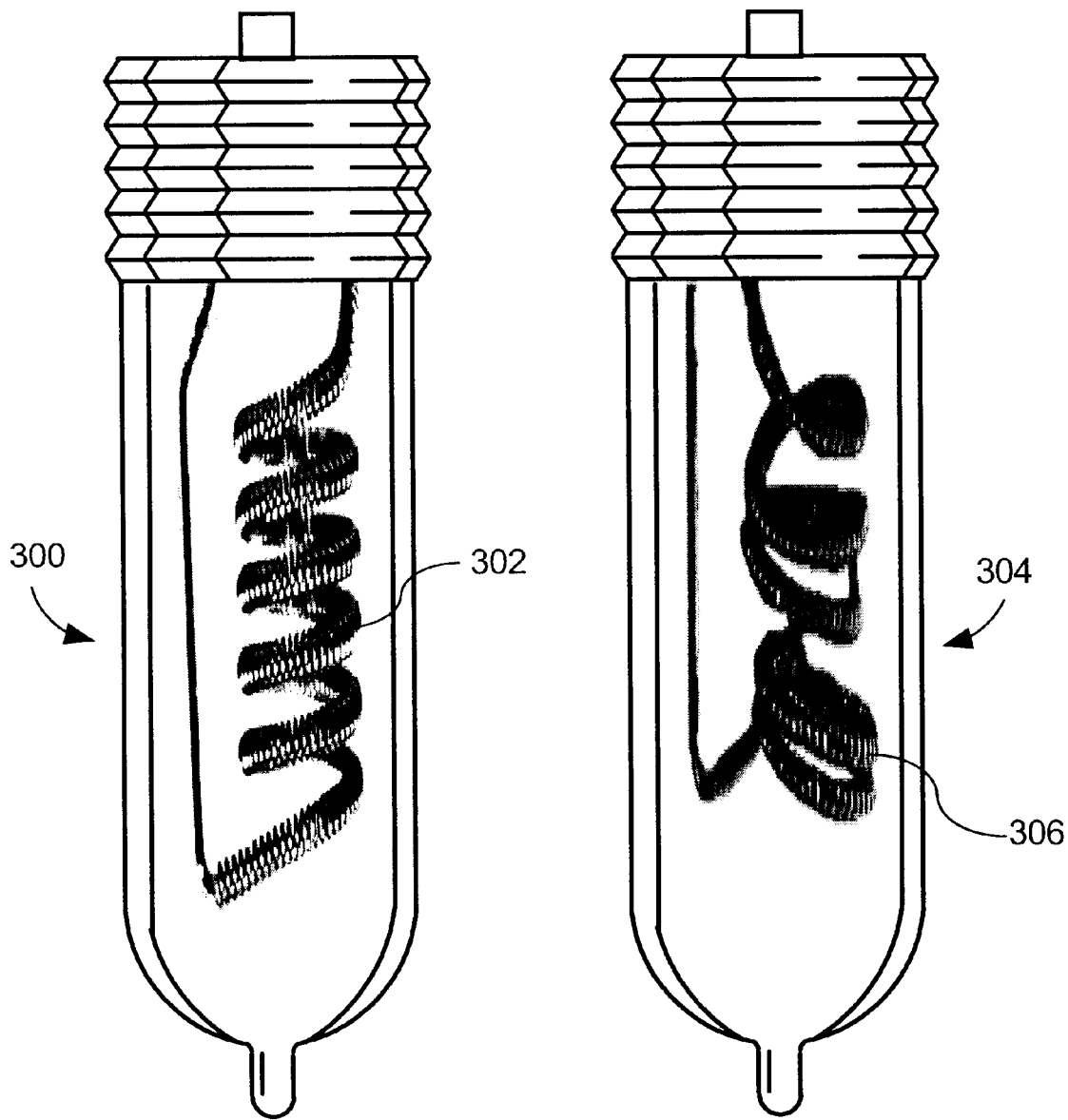
(PRIOR ART)
FIG. 3A
(PRIOR ART)
FIG. 3B

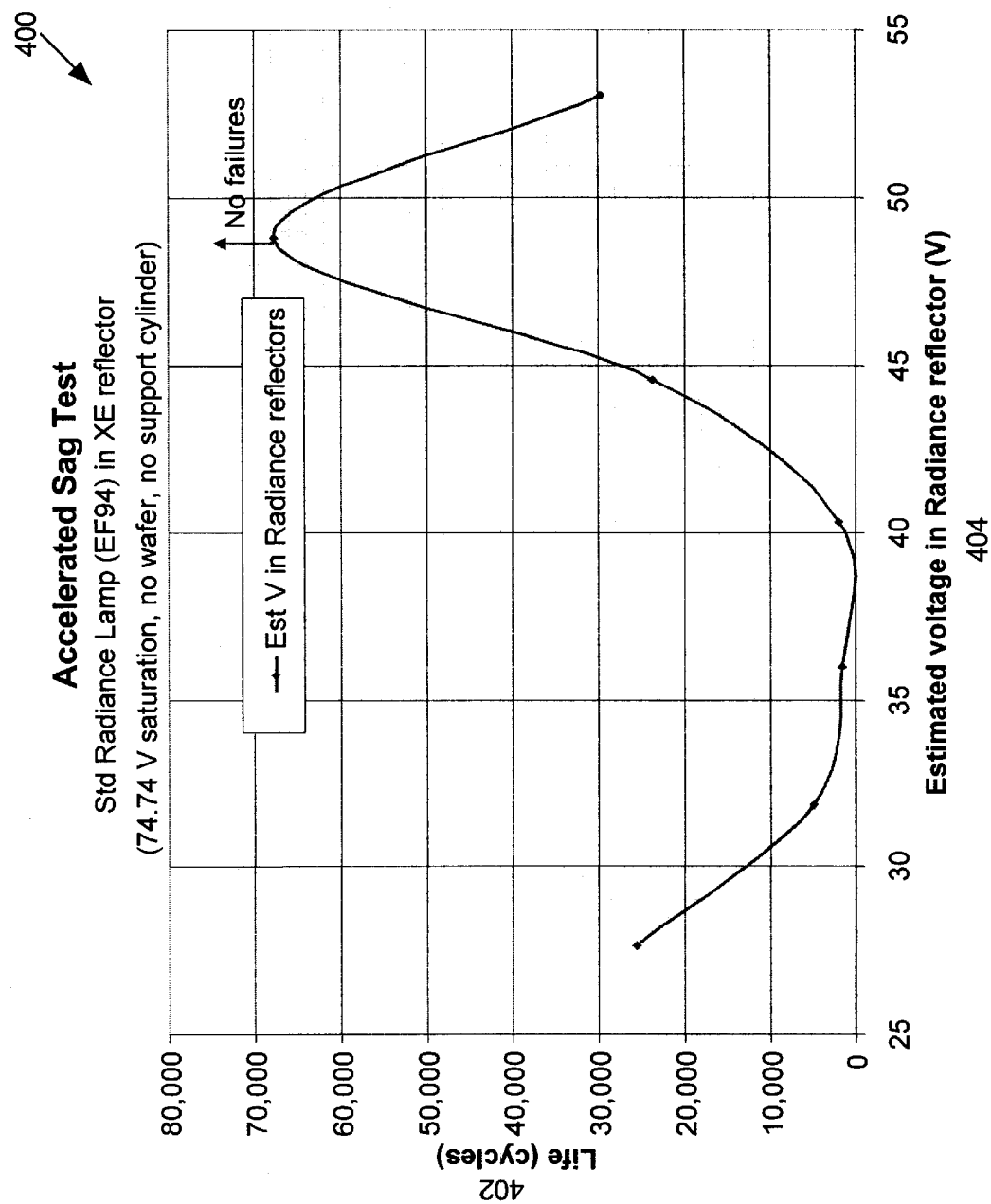
FIG. 4

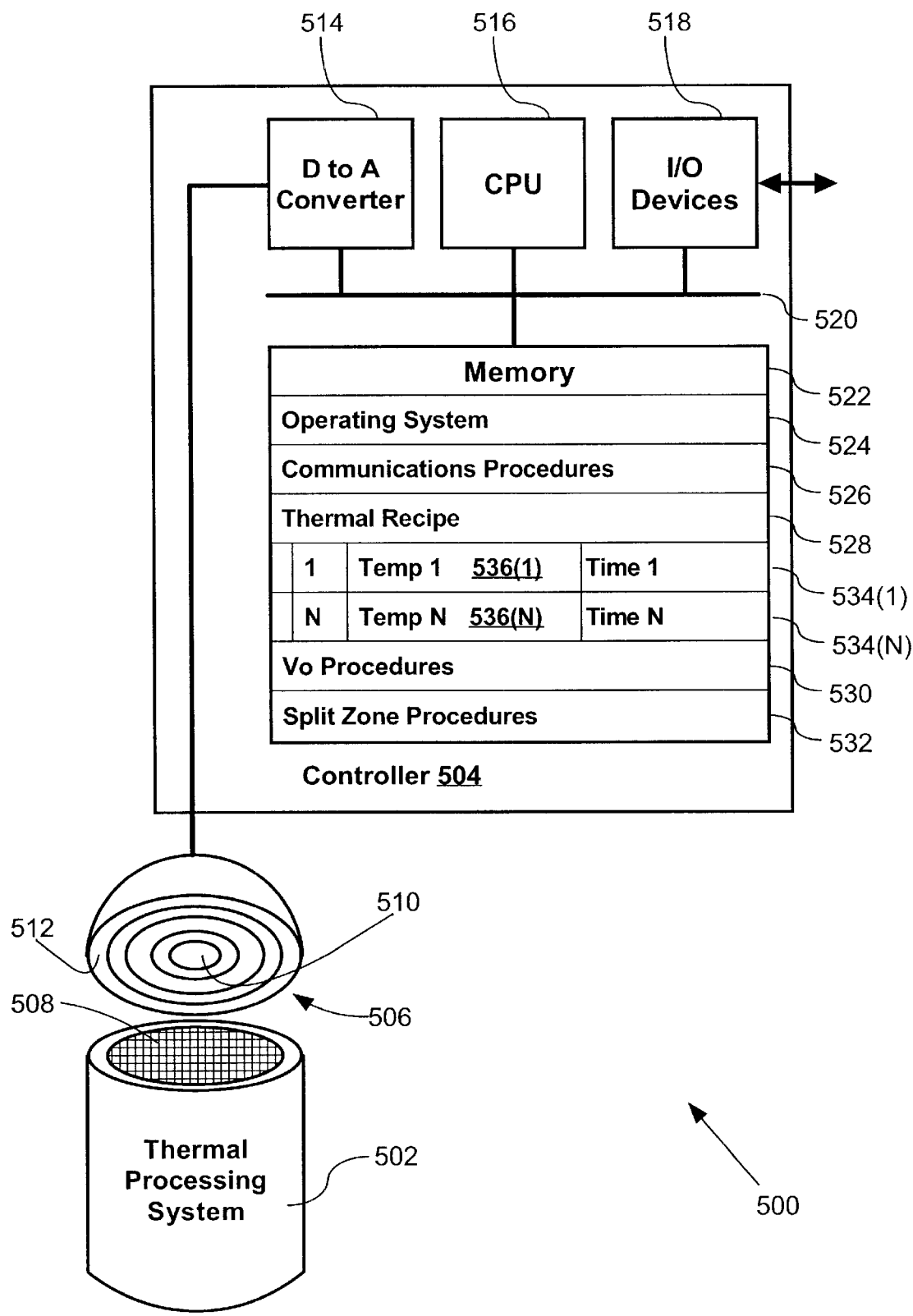
FIG. 5

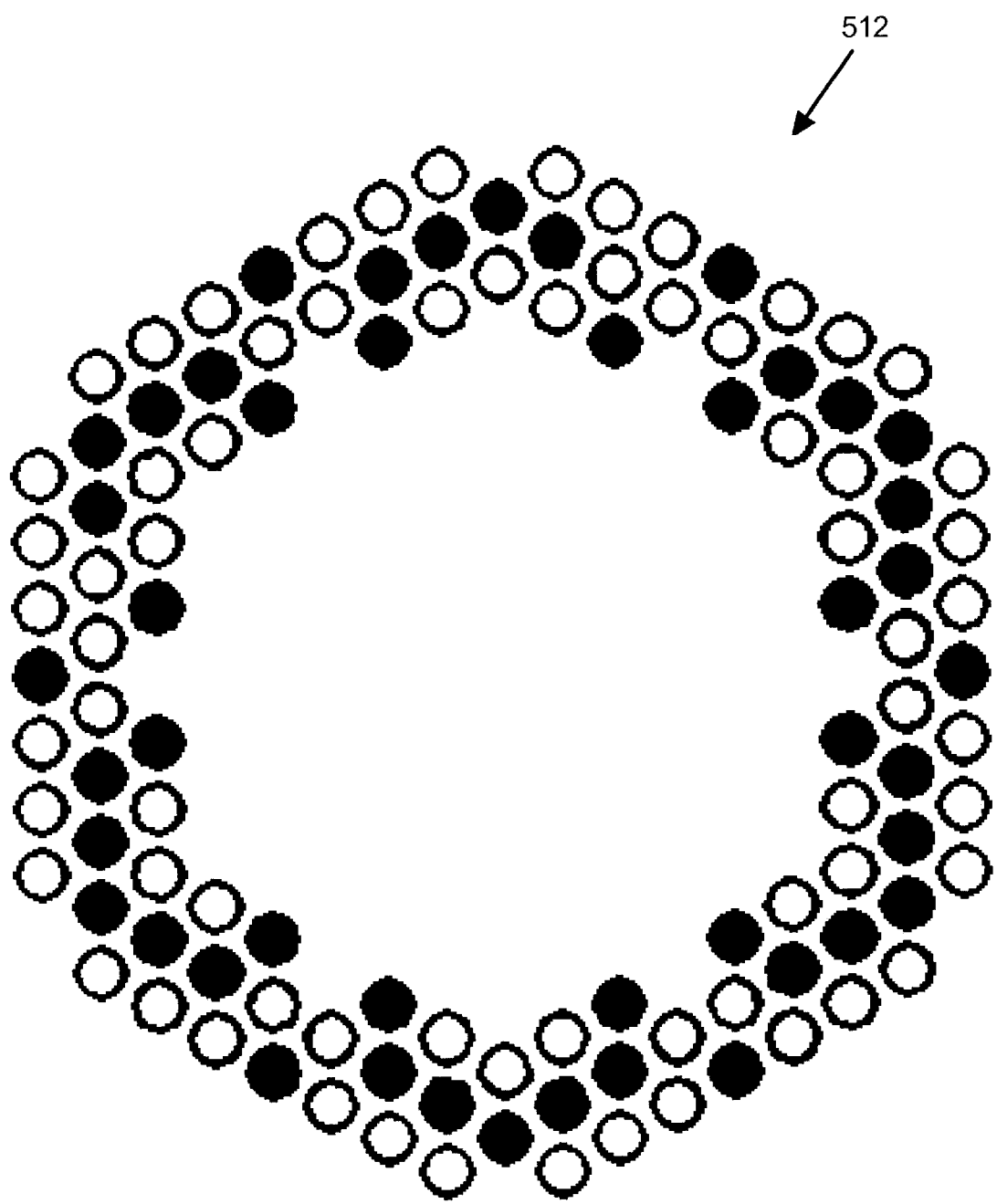
FIG. 6

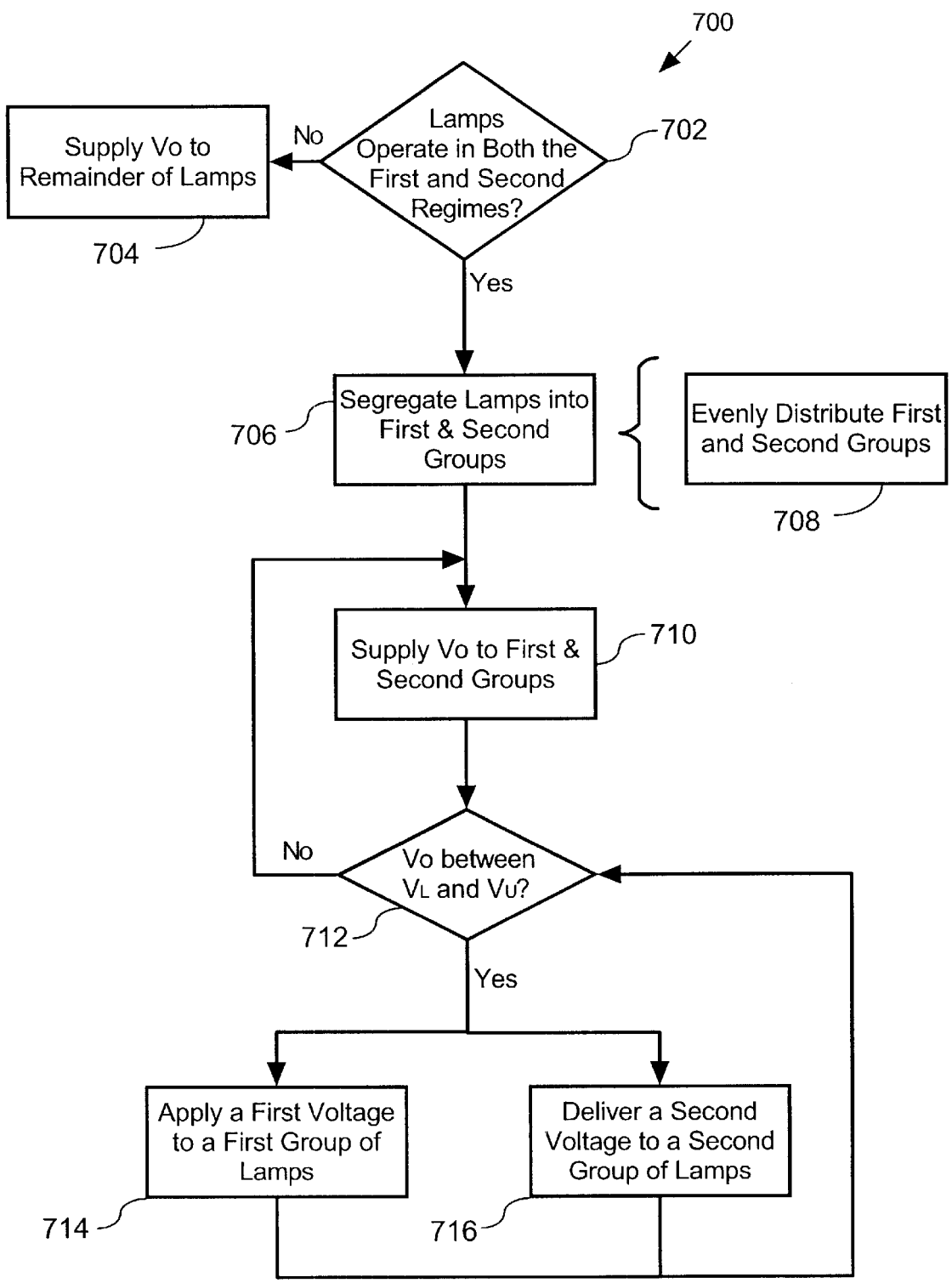
FIG. 7

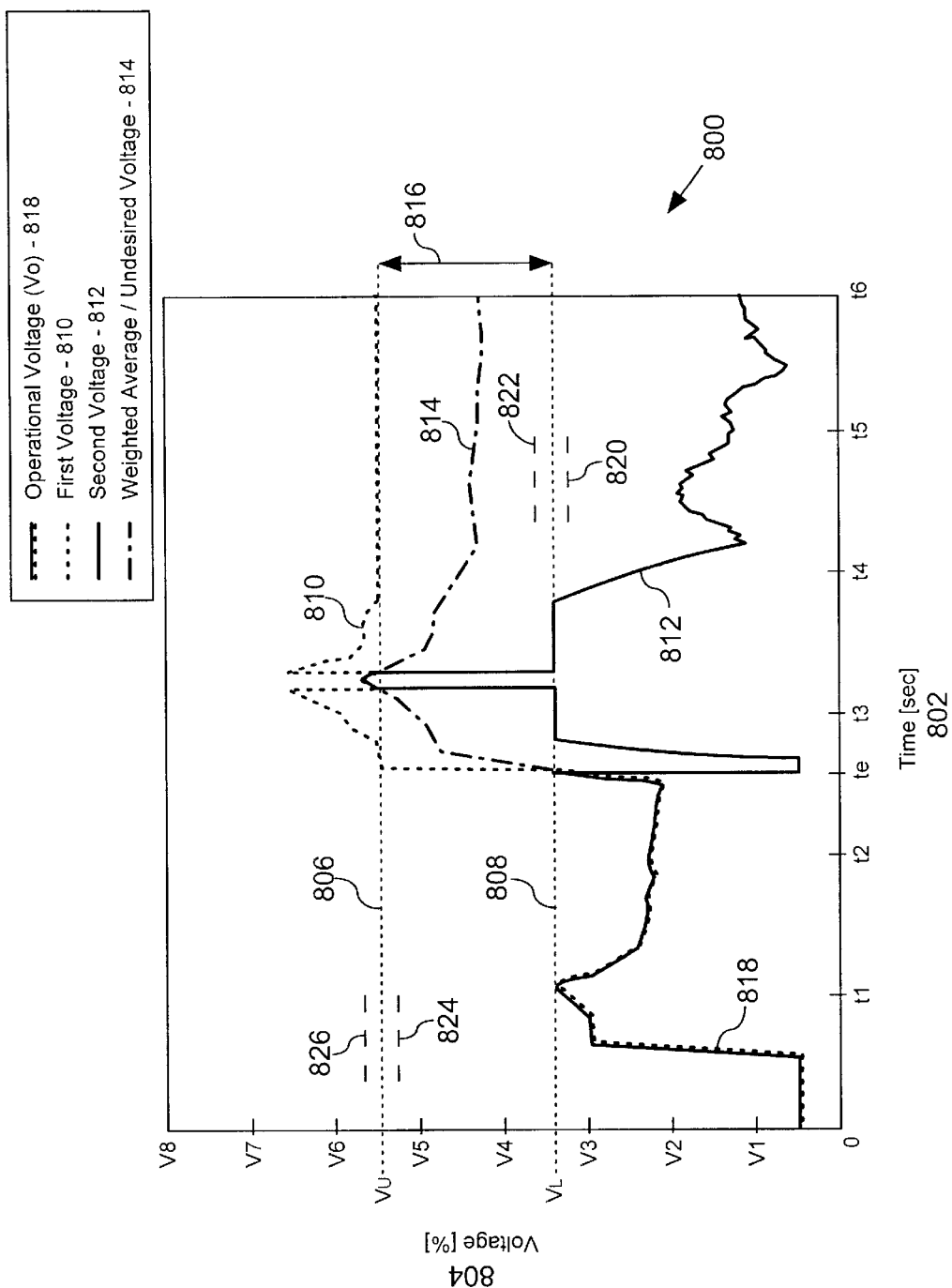

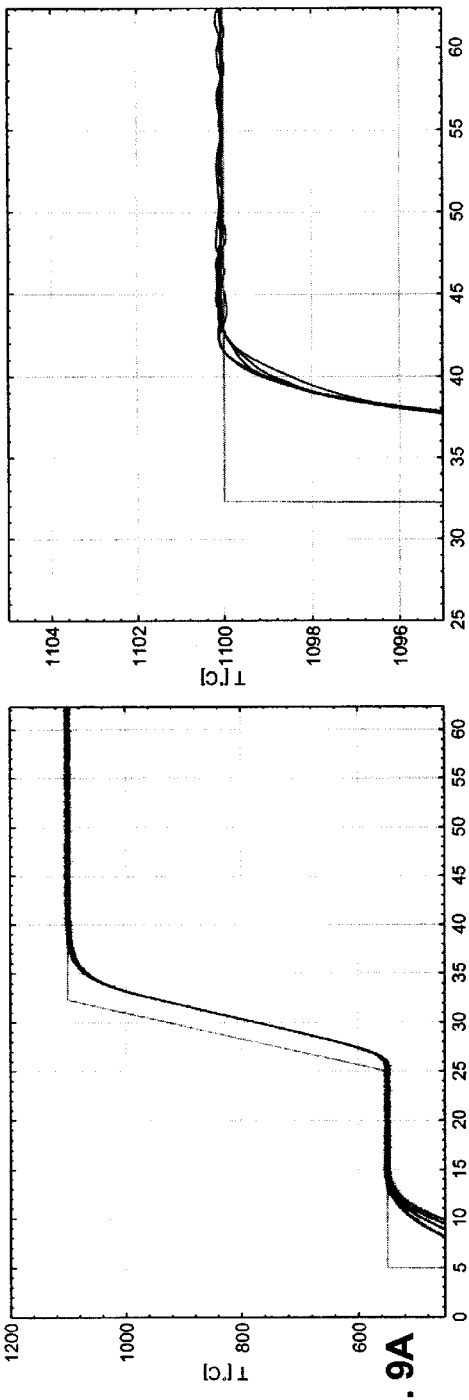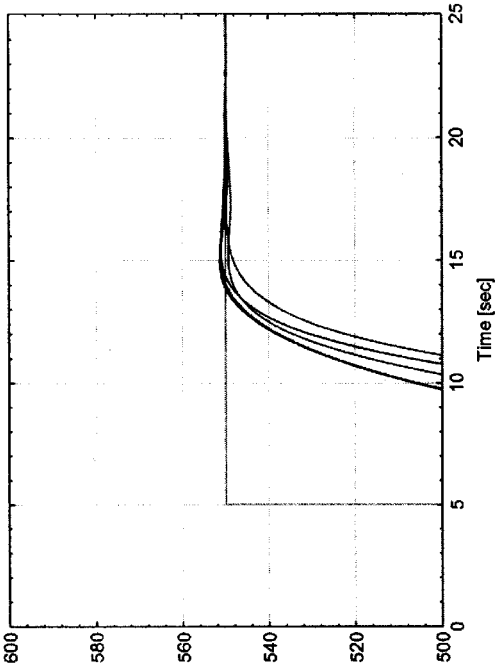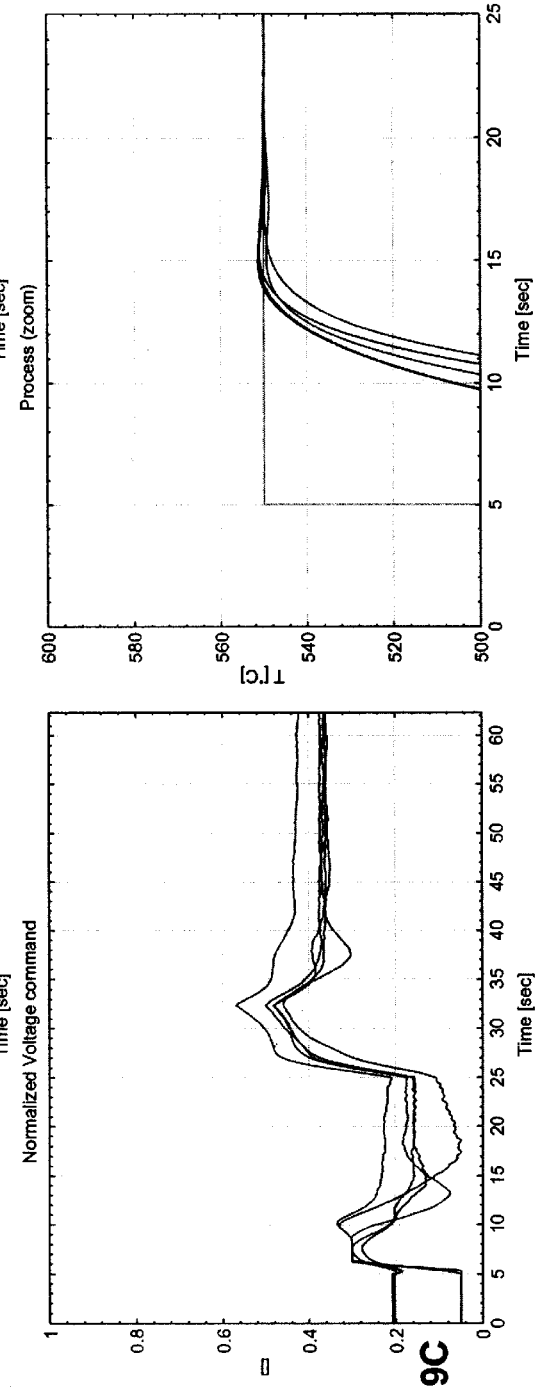
FIG. 9A  FIG. 9B  FIG. 9C  FIG. 9D

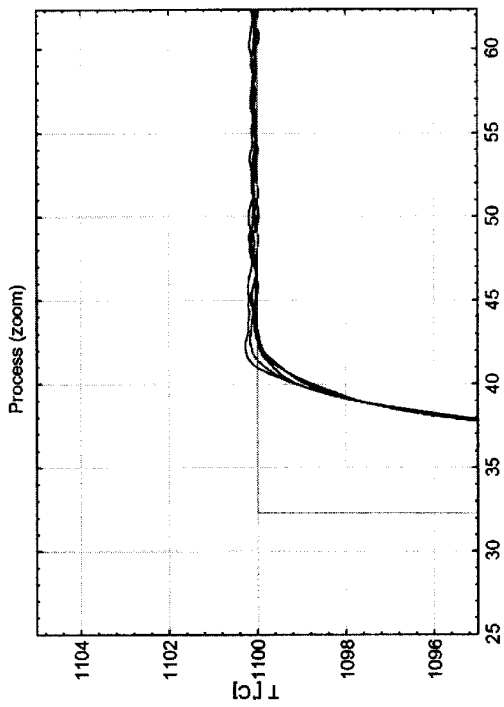
FIG. 10A
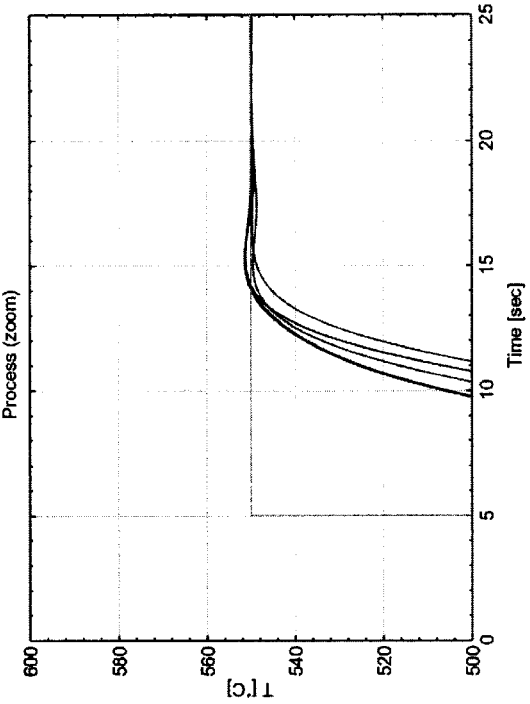
FIG. 10B
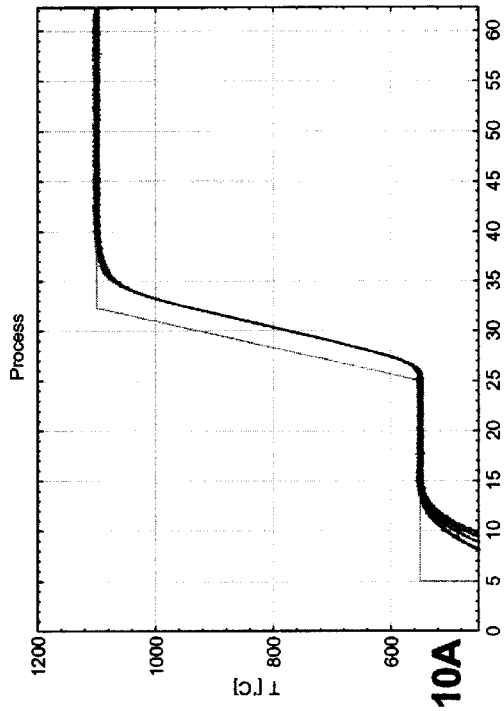
FIG. 10C
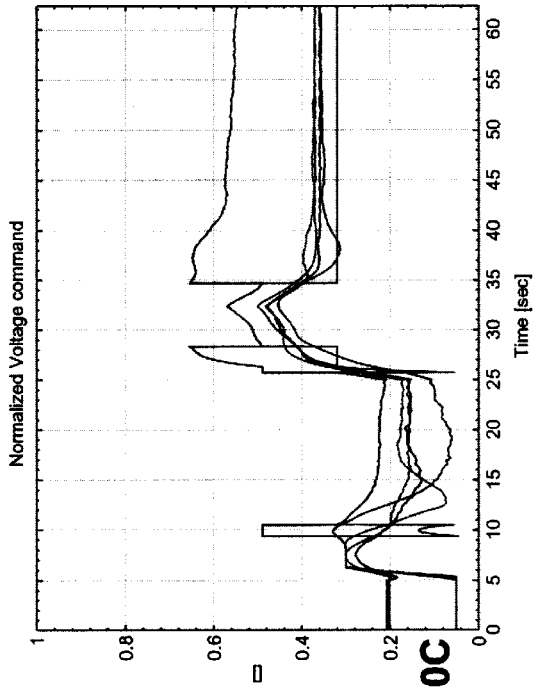
FIG. 10D

SYSTEM AND METHOD FOR LAMP SPLIT ZONE CONTROL

BACKGROUND OF THE INVENTION

1. Field of the Invention

The invention relates generally to thermal processing. More particularly, the invention is directed to a system and method for improving heating lamp reliability in semiconductor thermal processing systems.

2. Description of Related Art

Individual semiconductors or integrated circuit (IC) devices are typically formed on a semiconductor wafer by numerous different processes. In a number of these processes a thermal processing system is used to heat the semiconductor wafer to high temperatures so that various chemical and physical reactions can take place as the wafer is fabricated into multiple IC devices. These thermal processing systems typically include a heat source and a wafer holder for holding the semiconductor wafer adjacent the heat source during thermal processing.

Modem thermal processing systems heat the semiconductor wafers under controlled conditions according to predetermined thermal recipes. These thermal recipes fundamentally consist of a temperature that the semiconductor wafer must be heated to, and the time that the thermal processing system remains at that temperature. For example, thermal recipes may require the semiconductor wafer to be heated to distinct temperatures between 30 and 1200 degrees Celsius, for processing times at each distinct temperature of between and 0 and 60 seconds.

To meet certain objectives, such as minimal diffusion, these thermal processing systems must also restrict the amount of time that each semiconductor wafer is subjected to a high temperature. To accomplish this, the temperature ramp rate is often very steep, i.e., the thermal processing system often needs to change from a high to low temperature, or visa versa, in as short a time as possible.

These steep temperature ramp rates led to the development of Rapid Thermal Processing (RTP). During RTP the semiconductor wafer is irradiated with a radiant heat source powerful enough to quickly raise the temperature of the semiconductor wafer to the desired process temperature and hold it at that temperature for a sufficient period of time to accomplish a specific process step. Typical temperature ramp rates for RTP range from 20–100 degrees Celsius/second as compared to 5–15 degrees Celsius/minute for conventional furnaces.

RTP is typically used for thermal oxidation, Chemical Vapor Deposition (CVD), wafer bonding, and annealing. What is more, RTP is rapidly becoming the technology of choice for oxidation and annealing steps in advanced ultra-large scale integration (ULSI) fabrication.

The radiant heat sources used in RTP systems mostly consist of tungsten-halogen or arc lamps arranged in a linear or circular array. This array is typically located directly above, below, or both above and below the semiconductor wafer. RTP systems may also rotate the semiconductor wafer to more evenly distribute temperature across the surface of the semiconductor wafer.

Since these lamps have very low thermal mass relative to furnaces, the wafer can be heated rapidly. Rapid wafer cooling is also easily achieved since the heat source may be turned off quickly without requiring a slow temperature ramp-down. Lamp heating of the wafer minimizes the thermal mass effects of the process chamber and allows rapid real time control over the wafer temperature.

An example of a typical prior art RTP system 102 is shown in FIG. 1. The RTP system 102 is shown in an open or non operational position. Such an RTP system 102 comprises a lid 104 housing a circular array of heating lamps 110, and a RTP chamber 108 housing a semiconductor wafer 106. These arrays typically have about 211 lamps for a 200 mm semiconductor wafer.

While these RTP systems allow rapid heating and cooling, the temperature uniformity across the diameter of the semiconductor wafer is sensitive to radiative and conductive heat losses through the RTP chamber 108 walls. This results in wafer temperature non-uniformities usually appearing near the semiconductor wafer edges. Non-uniformity is undesirable since it leads to nonuniform material properties, such as alloy content, grain size, and dopant concentration. These nonuniform material properties degrade the circuitry and decrease IC device yield per semiconductor wafer.

One system for compensating for these wafer temperature non-uniformities separates the array of heating lamps into multiple independently controlled heating zones arranged in a plurality of concentric rings. An example of such a system is disclosed in Applicant's U.S. Pat. No. 5,689,614, which is incorporated herein by reference. Applicant's tools incorporating such as system is sold under the RADIANCE® brand. At predetermined times during the thermal cycle, the temperature of the outer heating zone is raised higher than the inner heating zones to compensate for any heat losses to the RTP chamber wall and/or the process kit. The process kit is the edge ring and support cylinder. The wafer sits on the edge ring throughout processing. The edge ring is made of Silicon Carbide and it's presence increases the thermal mass at the edge of the wafer.

FIG. 2 is a graph 200 of the temperature difference between the center 202 and edge 204 of a semiconductor wafer as a function of time for a RTP system similar to that shown in FIG. 1 and having multiple independently controlled heating zones. During the temperature ramp-up period of the thermal cycle the zone near the edge 204 of the semiconductor wafer is at a higher temperature than the zone at the center 202 of the semiconductor wafer. Whereas, during the soak and ramp-down periods the zone near the edge 204 is cooler than the zone at the center 202.

However, individual lamps of these inner and outer zones tend to degrade at different rates. In particular, users of these multi zoned circular lamp arrays have found that the outer zone lamps tend to have a lower reliability and fail more often than the inner zone lamps, i.e., they had a lower life than that predicted. No reason for this increased failure was known other than that the outer zone lamps sometimes operated at a higher temperature to compensate for heat loss near the wafer's edge. Indeed, lamps tested through the same amount of thermal cycles did not have the same increased failure as those used in actual IC device fabrication.

FIG. 3A shows a typical tungsten-halogen lamp 300 from an inner heating zone, after a set amount of thermal cycles. Notice that the coils of the filament 302 are evenly spaced. These tungsten-halogen lamps are made by PHILIPS, OSRAM, USHIO, etc. In contrast, FIG. 3B shows a failed outer zone lamp 304 from actual IC device fabrication after the same amount of thermal cycles. Here, the coils of filament 306 can be seen to be sagging.

Sagging occurs as the filaments plastically deform in response to an applied shear stress, such as gravity. Typically, a primary turn of the filament is wound first. This coiled wire is wound again into a larger coil to form a secondary turn. Stress on the coil is a function of the diameter of the primary turn and the lever arm created by the secondary turn as well as the number of secondary turns. Creep appears at the top of the coil where the stress is at a maximum causing the filament to sag until the lower coils are in contact causing a short or arc. This is called "coil stacking." The progression of sag is not linear in time and appears just before failure. Once sag occurs, the coils touch one another, thereby shorting-out the filament and destroying the lamp 304. This is known in the lamp industry as filament arcing or arc-out.

In light of the above, there is a need for a system and method that identifies and addresses the cause of this lower than predicted lamp reliability. Particularly, it would be highly desirable to have a system and method for increasing lamp life for outer zone lamps of a multi-zone circular lamp array.

BRIEF SUMMARY OF THE INVENTION

According to the invention there is provided a method for increasing lamp life in a thermal processing system. Initially, a portion of heating lamps that are required to operate in both first and second regimes are identified. The heating lamps preferably form part of a circular array of heating lamps having multiple annular concentric zones. The first regime is a regime where the lamp operates at a high voltage (VH) for fast temperature ramping, while the second regime is a regime where the lamp operates at a moderate voltage for maintaining a soak temperature and/or for slow to moderate temperature ramping. The portion is then segregated into the first and second groups. An operating voltage is supplied to first and second groups in accordance with a recipe for thermally processing a semiconductor wafer. It is then determined that the operating voltage is an undesired voltage in a range of voltages between a predetermined lower voltage (VL) and a predetermined upper voltage ($V_U$). Subsequently, a first voltage is applied to the first group of heating lamps and a second voltage is delivered to the second group of heating lamps. The first voltage is above the predetermined upper voltage, while the second voltage is below the predetermined lower voltage. Also, a weighted average of the first and second voltages approximates the undesired voltage. In the meantime, the operational voltage is supplied to a remainder of the array of heating lamps in accordance with the recipe, where the operational voltage is below the high voltage (VH).

Further according to the invention there is provided a method for increasing lamp life by supplying an operating voltage to a lamp. Subsequently determining that the operating voltage is in a range of voltages between a predetermined lower voltage and a predetermined upper voltage, and thereafter delivering to the lamp either a first voltage above the predetermined upper voltage or a second voltage below the predetermined lower voltage.

Still further according to the invention there is provided a system for increasing lamp life in a thermal processing system. The system comprises a thermal processing system having an array of heating lamps. The system also comprises a controller coupled to the array of heating lamps. The controller comprises a central processing unit and a memory. The memory includes a recipe for thermally processing a semiconductor wafer, and operational voltage procedures for controlling an operational voltage supplied to the array of heating lamps. The memory also includes split zoned procedures. These split zone procedures comprise instructions for supplying an operating voltage to the first and second groups of the array of heating lamps in accordance with the recipe, and instructions for determining that the operating voltage is an undesired voltage in a range of voltages between a predetermined lower voltage and a predetermined upper voltage. The undesired voltage is a voltage required for a moderate temperature soak and/or for slow to moderate temperature ramping.

The split zone procedures also comprise instructions for applying a first voltage to the first group of heating lamps, and instructions for delivering a second voltage to the second group of heating lamps.

Therefore, the above methods and system addresses the cause of a lower than predicted lamp reliability by increasing lamp life for the outer zone lamps of a multi-zone circular lamp array.

BRIEF DESCRIPTION OF THE DRAWINGS

For a better understanding of the nature and objects of the invention, reference should be made to the following detailed description, taken in conjunction with the accompanying drawings, in which:

FIG. 1 is a diagrammatic view of a prior art Rapid Thermal Processing (RTP) system that uses a circular array of heating lamps;

FIG. 2 is a graph of the temperature of a semiconductor wafer as a function of time for prior art thermal processing systems similar to that shown in FIG. 1;

FIG. 3A shows a typical prior art inner zone tungsten-halogen lamp after a set amount of thermal cycles;

FIG. 3B shows a failed prior art outer zone lamp after the same amount of thermal cycles as the lamp in FIG. 3A;

FIG. 4 is a graph of the results of an accelerated sag test for lamp life cycles as a function of voltage;

FIG. 5 is a schematic of a system for improving lamp reliability using split zone control, according to an embodiment of the invention;

FIG. 6 is a schematic front view of an outer zone of a circular array of heating lamps, according to an embodiment of the invention;

FIG. 7 is a flow chart of a method for improving lamp reliability using split zone control, according to an embodiment of the invention;

FIG. 8 is an exemplary graph of a thermal cycle for an operational voltage as a function of time in accordance with an embodiment of the invention;

FIGS. 9A, 9B, and 9D are graphs of the temperature of various zones of a circular array of heating lamps as a function of time, according to a test performed without using the split zone system;

FIG. 9C is a graph of the operational voltage supplied to various zones of a circular array of heating lamps as a function of time, according to the test shown in FIG. 9A;

FIGS. 10A, 10B, and 10D are graphs of the temperature of various zones of a circular array of heating lamps as a function of time, according to a test performed using the split zone system, according to an embodiment of the invention; and FIG. 10C is a graph of the operational voltage supplied to various zones of a circular array of heating lamps as a fiction of time, according to the test shown in FIG. 10A.

Like reference numerals refer to corresponding parts throughout the several views of the drawings.

DETAILED DESCRIPTION OF THE INVENTION

Tests were conducted to determine why users of circular multi-zone lamp arrays were experiencing greater than predicted failures of outer zone heating lamps. FIG. 4 is a graph 400 of the results of an accelerated sag test for heating lamp life (thermal cycles) 402 as a function of voltage 404. This test was conducted using a water-cooled single lamp fixture with a standard lamp (EF940) used in a RADIANCE® chamber in an atmospheric XE reflector sleeve. No semiconductor wafer or support cylinder was used. Also, a 74.74 V voltage saturation was used.

This graph 400 depicts the reported life of a lamp in an outer zone of an array of heating lamps. The outer zone is described in further detail below in relation to FIGS. 5 and 6. Lamps in the outer zone generally operate in a combination of two regimes, namely a first regime where the lamp operates at a high voltage (VH), as required for fast temperature ramping, and a second regime where the lamp operates at a moderate voltage for maintaining a soak temperature and/or slow to moderate temperature ramping. Typically, the voltage supplied to a lamp in the first regime is above about 70% of the full power output of a lamp, while the voltage supplied to a lamp in the second regime is between about 20% and 50% of the full power output of a lamp. By themselves these regimes are fairly innocuous, however, in combination they are catastrophic.

Typically, it is only the outer zone of a circular heating array that operates in both of these regimes, as only the outer zone needs a high voltage (VH) output followed by a moderate voltage for temperature soak. This is because the outer zone suffers from greater than normal thermal losses to the walls and the process kit at the edge of the wafer. Only the outer zones ever experience the first regime.

As can be seen, lamp life of these outer zone lamps is dramatically reduced when the lamp operates in both the first and second regimes, i.e., at both a high voltage (not shown), and, as shown, at a moderate soak voltage, such as between 30 to 45 V. The life of these lamps was found to be well under 30,000 cycles, as compared to the life of inner zone lamps that is typically well over 150,000 cycles. An investigation into the mechanisms that cause this reduced life was undertaken.

What was determined was that to prevent sag and eventual arc-out as described in relation to FIG. 3B, manufacturers insert potassium into the filament. This potassium forms bubbles, during operation when the filament is at elevated temperature, which inhibit sag of the coil by interrupting grain boundary movement. To be effective, there must be an even distribution of many small bubbles in the filament. However, in the first regime the potassium bubbles coalesce into a few large bubbles. This results in larger regions of the filament where there are no bubbles. Grain boundaries in these regions can now move freely in response to stress-leading to sag.

Furthermore, oxygen solubility in Tungsten (the main chemical species of the filament) is a decreasing function of temperature. Therefore, in the second regime, where moderate soak temperatures (typically about 1100 degrees Celsius) follow directly after a fast temperature ramp-up, oxygen diffuses into the tungsten. The supersaturated oxygen in the Tungsten collects in the potassium bubbles and contributes to potassium bubble migration.

Consequently, the operation in both of the two regimes significantly promotes sag, thereby leading to premature lamp failure. Therefore, to increase lamp reliability and decrease premature lamp failure, lamp operation in both the first and second regimes should be reduced or eliminated. This solution is, however, problematic, as lamps in the outer zone need to operate in both the first and second regimes in order to generate the heat required for the thermal recipe.

FIG. 5 is a schematic of the system architecture 500 for improving lamp reliability using split zone control, according to an embodiment of the invention. A thermal processing system 502 is coupled to a controller 504. The thermal processing system 502 is any system comprising of an array of heating lamps 506, such as an RTP system. The heating lamps 506 are any lamp used for heating, such as tungsten-halogen heating lamps. For ease of explanation, the thermal processing system 502 is shown in an open and non-operable position, thereby exposing a semiconductor wafer 508. In a preferred embodiment, the array of heating lamps 506 are arranged in a multi-input/multi-output array of independently controlled zones. A central circular zone 510 is surrounded by consecutive concentric annular zones terminating at an outer zone 512. In use, this outer zone 512 is disposed near the semiconductor wafer's edge.

The controller 504 controls the operational voltage supplied to each zone in accordance with a thermal recipe. There is a direct relationship between the operational voltage and the temperature called for by the thermal recipe, i.e., an increase in the operational voltage supplied to a lamp directly increases the lamps temperature, and visa versa. The controller 504 preferably includes: at least one data processor or central processing unit (CPU) 516; a memory 522; input and output devices 518, such as a monitor, keyboard, and floppy disk drive; a digital to analog converter 514 for converting a digital signal into an analog voltage; and at least one bus 520 that interconnects these components.

Memory 522 preferably includes an operating system 524, such as VXWORKS, LINUX, or WINDOWS having instructions for processing, accessing, storing, or searching data, etc. Memory 522 also preferably includes communications procedures 526 for communicating with the input and output devices 518; at least one thermal recipe 528; operational voltage (Vo) procedures 530; and split zone procedures 532.

The thermal recipe 528 is a recipe for thermally processing a semiconductor wafer, and fundamentally consists of two components: a) a temperature 536(1)–(N) that the semiconductor wafer 508 must be heated to, and b) a time 534(1)–(N) that the thermal processing system remains at that temperature 536(1)–(N). For example, a thermal recipe may require the semiconductor wafer to be heated to distinct temperatures between 30 and 1200 degrees Celsius for processing times at each distinct temperature of between and 0 and 60 seconds. The thermal recipe may change between semiconductor wafer batches, therefore, multiple thermal recipes may be loaded into memory 522 via the input/output devices 518.

The operational voltage (Vo) procedures 530 convert the temperature 536(1)–(N) required by the thermal recipe 528 into a digital signal that is transmitted to the digital to analog converter 514, which converts the digital signal into an analog operational voltage that is delivered to the lamps in a particular zone.

The split zone procedures 532 automatically control the operational voltage supplied to first and second groups of lamps in the outer zone 512 to increase lamp reliability. A more detailed explanation of the use of the split zone procedures is provided in relation to FIGS. 6 through 10 below.

FIG. 6 is a schematic view of the outer zone 512 of the circular array of heating lamps 506 shown in FIG. 5. As explained above, the outer zone 512 has been found to be more prone to failure than the inner zones, because the lamps in the outer zone 512 operate in both the first and the second regimes.

To address this reduced reliability, the lamps in the outer zone are split into one or more groups that are independently controlled. This allows the split zone procedures 532 (FIG. 5) to control any lamp in the outer zone so that it does not operate both in the first and second regimes.

In a preferred embodiment, the outer most concentric zone 512 is divided into at least two groups of heating lamps, namely a first group 602 and a second group 604. For a system that thermally processes a 200 mm diameter semiconductor wafer 508 (FIG. 5), the first group preferably comprises 48 lamps, while the second group preferably comprises 66 lamps. The greater amount of lamps in the second group compensates for the fact that the first group 602 is closer on average to the center of the semiconductor wafer 508 (FIG. 5) than the second group and, therefore, is not as susceptible to thermal losses through the chamber wall.

The voltage supplied to the lamps in each of the first 602 and second 604 groups, is independently controlled by the split zone procedures 532 (FIG. 5) in the controller 504 (FIG. 5). Also, in a preferred embodiment, the lamps of the first and second groups are uniformly distributed among one another to prevent any temperature non-uniformity problems. It should be appreciated that although the outer zone is shown split into two groups, more than two groups may be used.

FIG. 7 is a flow chart 700 of a method for improving lamp reliability using split zone control, according to an embodiment of the invention. At some time after an independently controlled and multi-zoned heating array 506 (FIG. 5) is provided, it is determined at step 702 which lamps, or zones, operate in both the first and second regimes. Typically, the lamps or zones that operate in both the first and second regimes are only the lamps in the outer zone 512 (FIG. 5). However, in an alternative embodiment, any lamps that otherwise would operate in both the first and second regimes can be controlled by the split zone controller to increase lamp reliability.

If it is determined that certain lamps do not operate in both the first and second regimes (step 702-No), then the Vo procedures 530 (FIG. 5) supply at step 704 those lamps with an operational voltage (Vo) as per the thermal recipe 528 (FIG. 5). However, if it is determined that a certain portion of lamps operate in both the first and second regimes (step 702-Yes), then that portion of lamps is segregated at step 706 into at least a first group 602 (FIG. 6) and a second group (604) as described in relation to FIG. 6. In a preferred embodiment, the lamps of the first and second groups are uniformly distributed at step 708 among one another, as explained above.

An operational voltage is then supplied at step 710 to the first group and the second group. It is then determined at step 712 whether the operational voltage is an undesired voltage between a predetermined lower voltage (VL) and a predetermined upper voltage ($V_U$). The predetermined lower ($V_L$) and upper ($V_U$) voltages are established empirically by experiment. In a preferred embodiment, the upper voltage is in a range from 55% to 60% of a full power output, while the lower voltage is in a range from 19% to 34% of a full power output.

If it is determined that the operational voltage is not an undesired voltage between the lower voltage ($V_L$) and the upper voltage ($V_U$) (step 712-No), then the first and second groups continue to receive the operational voltage in accordance with the thermal recipe.

If, however, it is determined that the operational voltage is an undesired voltage between the lower voltage ($V_L$) and the upper voltage ($V_U$) (step 712-Yes), then the split zone procedures 532 (FIG. 5) at step 714 apply a first voltage to the first group, and at step 716 deliver a second voltage to the second group. The first voltage is always above the upper voltage ($V_U$) and the second voltage is always below the lower voltage ($V_L$). Also, a weighted average of the first and second voltages approximates the undesired voltage in the range of voltages between the lower voltage ($V_L$) and the upper voltage ($V_U$).

The split zone procedures 532 (FIG. 5) continue to apply a first voltage to the first group and a second voltage to the second group until it is determined that the operational voltage required to be supplied to the first and second groups, as called for by the thermal recipe, is not within the range of voltages between the lower voltage ($V_L$) and the upper voltage ($V_U$). When this is determined (step 712-No), then the regular operational voltage as called for by the thermal recipe and supplied by the Vo procedures 530 (FIG. 5), is supplied at step 710 to the first and second groups.

FIG. 8 is an exemplary graph 800 of a split zone thermal cycle for operational voltage 804 as a function of time 802. This graph 800 only shows the voltage applied to those lamps that operate within a range of voltages 816 between a predetermined lower voltage ($V_L$) 808 and a predetermined upper voltage ($V_U$) 806. This graph 800 also only shows the voltage supplied in terms of a thermal process that only operates in the second regime, i.e., typically well below 70% of the full power output of a lamp. In a preferred embodiment, these lamps are the lamps in the outer zone 512 (FIG. 5), i.e., the first group 602 (FIG. 6) and second group 604 (FIG. 6) of lamps.

As a thermal recipe 528 (FIG. 5) is initiated from time zero, the operational voltage 818 is ramped up from a voltage of approximately ½(V1) to above voltage V3 at time t1. The voltage fluctuates until approximately time "te" where the thermal recipe calls for a voltage above $V_L$ 808 to be supplied to the outer zone. As soon as the calculated operational voltage 818 is an undesired voltage in the range of voltages 816 between the lower voltage ($V_L$) 808 and the upper voltage ($V_U$) 806, the split zone procedures 532 (FIG. 5) apply a first voltage 810 to the first group 602 (FIG. 6) of heating lamps, and deliver a second voltage 812 to the second group 604 (FIG. 6) of heating lamps. The first voltage 810 is always above the upper voltage ($V_U$) 806 and the second voltage 812 is always below the lower voltage ($V_L$) 808. A weighted average 814 of the first and second voltages approximates the undesired voltage in the range of voltages 816, thereby satisfying the thermal recipe 528 (FIG. 5).

Tests have revealed that using the split zone system and method where the lower voltage ($V_L$) is set to between 19% and 34% of the full power output for a lamp, and/or the upper voltage ($V_U$) is set to between 55% and 60% of the full power output for a lamp, can significantly improve the life of these lamps.

To avoid voltage oscillations whenever transition takes place, i.e., at lower voltage ($V_L$) and upper voltage ($V_U$), a hysteresis band is introduced around each switching voltage ($V_L$ and $V_U$) so that the voltage lags before making a change. It has been found that an hysteresis band of between 3% to 12% is effective to prevent oscillation. A lower hysteresis band 820 and 822 is introduced around the lower voltage 808, and an upper hysteresis band 824 and 826 is introduced around the upper voltage 806.

For example, if the thermal recipe calls for an operational voltage that fluctuates just below and above the lower voltage ($V_L$), the voltage supplied to the lamps in the first and second groups will continuously be jumping between the operational voltage and either the first voltage or the second voltage. To avoid this situation, upper and lower hysteresis voltages are set on either side of the transition voltages ($V_U$ and $V_L$). For example, when the operational voltage is rising toward the lower voltage ($V_L$), the first and second voltages will only be applied to the first and second groups respectively, when the operational voltage crosses an upper hysteresis voltage 822. Conversely, when the undesired voltage as dictated by the thermal recipe lowers towards the lower voltage ($V_L$), the operational voltage will only be applied to the first and second groups when the undesired voltage crosses a lower hysteresis voltage 820. Similarly, upper and lower hysteresis voltages 826 and 824 are provided for the upper voltage ($V_U$).

In the case where the first voltage 810 supplied to the first group is very high, the second voltage 812 supplied to the second group must be very low so that the weighted average 814 of the first and second voltages can approximate the undesired voltage. However, in some situations, the first voltage is so high that in order to compensate, the second voltage is required to dip below the lamp's low saturation limit of 5%, i.e., to operate, the lamps cannot be supplied with a lower voltage. This saturation caused the weighted average 814 of the split voltage commands (First and second voltages) to be higher than the unsplit command, causing a rise in temperature. In response, the slip controller 504 (FIG. 5) slows the system down, causing the temperature to drop, causing a limit cycle.

To address this problem the first group is split into subgroups, where each subgroup has its own lower voltage ($V_L$). This prevents low saturation at 5%, by splitting off only one zone at a time. For example, the first group is split into third, fourth, and fifth groups. Then between a voltage of 31% and 37% only the third group is supplied with a first voltage above the upper voltage. Between a voltage of 37% to 47% both the third and the fourth groups are supplied with a first voltage above the upper voltage. Finally, between a voltage of 47% and 57% the third, fourth, and fifth groups are supplied with a first voltage above the upper voltage. The weighed average of the combination of the voltages must still approximate the voltage as required by the thermal recipe.

FIGS. 9A, 9B, and 9D are graphs of the temperature of various zones of a circular array of heating lamps as a function of time, according to a test performed without using the split zone system. Each line is for a separate temperature reading for a separate zone. FIG. 9A shows a thermal cycle as dictated by a thermal recipe from a temperature of 30 to 1200 degrees Celsius. As can be seen, the major temperature ramp-up occurs between about 26 seconds and 37 seconds. FIG. 9B is an enlarged graph of an upper temperature transition portion of the graph shown in FIG. 9A. As can be seen there are some minor temperature fluctuations as the temperature approaches 1100 degrees Celsius. FIG. 9D is an enlarged graph of a lower temperature transition portion of the graph shown in FIG. 9A. Again, some minor temperature fluctuations can be observed as the temperature approaches 550 degrees Celsius.

FIG. 9C is a graph of the operational voltage supplied to five various zones of a circular array of heating lamps as a function of time, according to the test shown in FIG. 9A. As can be seen, the voltage for one of the zones of heating lamps is raised to above about 50% of full power. This increased voltage is needed to ramp the temperature to the soak temperature of 1100 degrees Celsius. It is only this zone, typically the outer zone, that requires a high voltage, as the outer zone suffers from temperature losses through the chamber wall. After the soak temperature is reached, the voltage is dropped to about 44% to maintain this soak temperature. The outer zone, therefore, operates in both the first and second regimes, and, therefore, is subject to premature lamp failure.

FIG. 10C is a graph of the operational voltage supplied to various zones of a circular array of heating lamps as a function of time, in a test performed using the split zone system 500 (FIG. 5). The voltage supplied to the outer zone of the array of heating lamps is controlled by the split zone procedures 532 (FIG. 5). As can be seen, whenever the thermal recipe calls for the outer zone of lamps to enter the range of voltages between a predetermined lower voltage and a predetermined upper voltage, the split zone procedures 532 (FIG. 5) apply a first voltage to the first group of heating lamps and a second voltage to the second group of heating lamps. In this simulation the predetermined lower voltage is set to 34% of full power and the predetermined upper voltage is set to 55% of full power. The first voltage is always above the predetermined upper voltage and the second voltage is always below the predetermined lower voltage. A weighted average of the first and second voltages approximates the undesired voltage in the range of voltages, thereby satisfying the thermal recipe.

FIGS. 10A, 10B, and 10D are graphs of the temperature of various zones of a circular array of heating lamps as a function of time, in the same test as that reported in FIG. 10C. FIG. 10A shows a thermal cycle as dictated by the same thermal recipe used for the test of FIGS. 9A–9D. As can be seen, the major temperature ramp-up occurs between about 22 seconds and 42 seconds. FIG. 10B is an enlarged graph of an upper temperature transition portion of the graph shown in FIG. 10A. As can be seen there are some minor temperature fluctuations as the temperature approaches 1100 degrees Celsius. These fluctuations are no more than that of FIG. 9B. FIG. 10D is an enlarged graph of a lower temperature transition portion of the graph shown in FIG. 10A. Again, some minor temperature fluctuations can be observed as the temperature approaches 550 degrees Celsius. These fluctuations are no more than that of FIG. 9D. In other words, the temperature cycle of FIG. 10A closely matches the temperature cycle of FIG. 9A.

A comparison of FIGS. 9A–D and 10A–D shows that the split zone system and method does not adversely affect the thermal cycle as dictated by the thermal recipe. What is more, the split zone control system remains faithful to the thermal recipe, while restricting lamps from operating in both the first and second regimes, thereby increasing lamp reliability and raising individual lamp life.

The foregoing descriptions of specific embodiments of the present invention are presented for purposes of illustration and description. They are not intended to be exhaustive or to limit the invention to the precise forms disclosed, obviously many modifications and variations are possible in view of the above teachings. For example, the array of heating lamps does not necessarily have to be circular in shape. Also, the split zone control method and system can be used with any heating lamps, not merely those lamps in an RTP system or other system used in semiconductor fabrication. The embodiments were chosen and described in order to best explain the principles of the invention and its practical applications, to thereby enable others skilled in the art to best utilize the invention and various embodiments with various modifications as are suited to the particular use contemplated. Furthermore, the order of steps in the method are not necessarily intended to occur in the sequence laid out. It is intended that the scope of the invention be defined by the following claims and their equivalents.

What is claimed is:

1. A method for increasing lamp life in a thermal processing system, comprising:

supplying an operating voltage to first and second groups of an array of heating lamps in accordance with a recipe for thermally processing a semiconductor wafer;

determining that said operating voltage is an undesired voltage in a range of voltages between a predetermined lower voltage and a predetermined upper voltage;

applying a first voltage to said first group of heating lamps, where said first voltage is above said predetermined upper voltage; and delivering a second voltage to said second group of heating lamps, where said second voltage is below said predetermined lower voltage, such that a weighted average of said first and second voltages approximates said undesired voltage.

2. The method of claim 1, further comprising, prior to said supplying, identifying a portion of heating lamps, out of an array of heating lamps, that are required to operate in both a first regime where the lamp operates at a high voltage for fast temperature ramping, and a second regime where the lamp operates at a moderate voltage for maintaining a soak temperature and/or for slow to moderate temperature ramping; and segregating said portion into said first and second groups.

3. The method of claim 2, wherein said segregating further comprises uniformly distributing heating lamps of said first and second groups among one another.

4. The method of claim 2, further comprising supplying said operational voltage to a remainder of said array of heating lamps in accordance with said recipe, where said operational voltage is below said high voltage.

5. The method of claim 1, further comprising, prior to said supplying:

providing said array of heating lamps, where said array is a circular array; and identifying said first and second groups as those heating lamps that form a outer zone of said circular array.

6. The method of claim 1, wherein said upper voltage is in a range from 55% to 60% of a full power output for each lamp of said first and second groups.

7. The method of claim 1, wherein said lower voltage is in a range from 19% to 34% of a full power output for each lamp of said first and second groups.

8. The method of claim 1, wherein said undesired voltage is a voltage required for a moderate temperature soak and/or for slow to moderate temperature ramping.

9. The method of claim 1, further comprising:

ascertaining that said operational voltage is below said lower voltage; and supplying said operating voltage to said first and second groups.

10. The method of claim 1, further comprising:

ascertaining that said operational voltage is above said upper voltage; and supplying said operating voltage to said first and second groups.

11. The method of claim 1, wherein said determining further comprises ascertaining that said operating voltage is said undesired voltage in a range of voltages between a lower hysteresis voltage of a lower hysteresis band introduced around said upper voltage, and said lower voltage.

12. The method of claim 1, further comprising:

ascertaining that said operational voltage is below an upper hysteresis voltage of a lower hysteresis band introduced around said lower voltage; and supplying said operating voltage to said first and second groups.

13. The method of claim 1, further comprising:

ascertaining that said operational voltage is above an upper hysteresis voltage of an upper hysteresis band introduced around said upper voltage; and supplying said operating voltage to said first and second groups.

14. The method of claim 1, further comprising:

ascertaining that said undesired voltage is below a lower hysteresis voltage of an upper hysteresis band introduced around said upper voltage; and applying said first voltage to said first group of heating lamps; and delivering said second voltage to said second group of heating lamps.

15. The method of claim 1, wherein said first group is split into multiple subgroups each having a different lower voltage.

16. A method for increasing lamp life, comprising:

supplying an operating voltage to first and second groups of an array of heating lamps;

determining that said operating voltage is an undesired voltage in a range of voltages between a predetermined lower voltage and a predetermined upper voltage;

applying a first voltage to said first group of heating lamps, where said first voltage is above said predetermined upper voltage; and delivering a second voltage to said second group of heating lamps, where said second voltage is below said predetermined lower voltage, such that a weighted average of said first and second voltages approximates said undesired voltage.

17. A method for increasing lamp life in a thermal processing system, comprising:

supplying an operating voltage to a lamp in accordance with a thermal recipe for thermally processing a semiconductor wafer;

determining that said operating voltage is in a range of voltages between a predetermined lower voltage and a predetermined upper voltage;

delivering to said lamp either a first voltage above said predetermined upper voltage or a second voltage below said predetermined lower voltage.

18. A method for increasing lamp life, comprising:

supplying an operating voltage to a lamp;

determining that said operating voltage is in a range of voltages between a predetermined lower voltage and a predetermined upper voltage;

delivering to said lamp either a first voltage above said predetermined upper voltage or a second voltage below said predetermined lower voltage.

19. A system for increasing lamp life in a thermal processing system, comprising:

a thermal processing system having an array of heating lamps;

a controller coupled to said array of heating lamps, where said controller comprises:

a central processing unit; and a memory comprising:

a recipe for thermally processing a semiconductor wafer;

operational voltage procedures for controlling an operational voltage supplied to said array of heating lamps; and split zoned procedures comprising:

instructions for supplying an operating voltage to first and second groups of said array of heating lamps in accordance with said recipe;

instructions for determining that said operating voltage is an undesired voltage in a range of voltages between a predetermined lower voltage and a predetermined upper voltage;

instructions for applying a first voltage to said first group of heating lamps, where said first voltage is above said predetermined upper voltage; and instructions for delivering a second voltage to said second group of heating lamps, where said second voltage is below said predetermined lower voltage, such that a weighted average of said first and second voltages approximates said undesired voltage.

20. The system of claim 19, wherein said split zoned procedures further comprise:

instructions for identifying a portion of heating lamps, out of an array of heating lamps, that are required to operate in both a first regime where the lamp operates at a high voltage for fast temperature ramping, and a second regime where the lamp operates at a moderate voltage for maintaining a soak temperature and/or for slow to moderate temperature ramping; and instructions for segregating said portion into said first and second groups.

* * * * *